United States Patent
Kumar et al.

(10) Patent No.: US 10,453,747 B2
(45) Date of Patent: Oct. 22, 2019

(54) DOUBLE BARRIER LAYER SETS FOR CONTACTS IN SEMICONDUCTOR DEVICE

(71) Applicant: GLOBALFOUNDRIES INC., Grand Cayman (KY)

(72) Inventors: Aditya Kumar, Saratoga Springs, NY (US); Shiv Kumar Mishra, Mechanicville, NY (US); Jean-Baptiste Jacques Laloë, Saratoga Springs, NY (US); Wen Zhi Gao, Rexford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/687,591

(22) Filed: Aug. 28, 2017

(65) Prior Publication Data

US 2019/0067098 A1 Feb. 28, 2019

(51) Int. Cl.
*H01L 21/768* (2006.01)
*H01L 21/02* (2006.01)
(Continued)

(52) U.S. Cl.
CPC .. *H01L 21/76895* (2013.01); *H01L 21/02063* (2013.01); *H01L 21/02068* (2013.01); *H01L 21/28556* (2013.01); *H01L 21/28568* (2013.01); *H01L 21/76805* (2013.01); *H01L 21/76814* (2013.01); *H01L 21/76846* (2013.01); *H01L 21/76889* (2013.01); *H01L 23/535* (2013.01); *H01L 23/53266* (2013.01)

(58) Field of Classification Search
None
See application file for complete search history.

(56) References Cited

U.S. PATENT DOCUMENTS 5,242,860 A * 9/1993 Nulman ............ H01L 21/76843
257/915
5,449,954 A * 9/1995 Ito ..................... H01L 21/76843
257/751

(Continued)

OTHER PUBLICATIONS

Ramanath et al. "W deposition and titanium fluoride formation during WF6 reduction by Ti: Reaction path and mechanisms", Journal of Applied Physics, vol. 85, No. 3, Feb. 1, 1999, pp. 1961-1969.

(Continued)

*Primary Examiner* — Lex H Malsawma
(74) *Attorney, Agent, or Firm* — Anthony Canale; Hoffman Warnick LLC (57) ABSTRACT

Methods of forming a contact for a semiconductor device with double barrier layer sets, and a device so formed are disclosed. Methods may include: depositing a first metal layer contacting a semiconductor substrate in a contact opening; depositing a first nitride barrier layer on the first metal layer; and annealing after depositing the first nitride barrier layer to form silicide region in a junction area underlying the contact opening with the first metal layer and the semiconductor substrate. After the annealing, a second metal layer may be deposited, followed by a second nitride barrier layer. A conductor is formed in a remaining portion of the contact opening. The double barrier layer sets prevent the formation of volcano defects and also advantageously reduce contact resistance.

17 Claims, 4 Drawing Sheets

(51) Int. Cl.
*H01L 21/285* (2006.01)
*H01L 23/532* (2006.01)
*H01L 23/535* (2006.01)

(56) References Cited

U.S. PATENT DOCUMENTS

| | | | | |
|---|---|---|---|---|
| 5,514,908 A * | 5/1996 | Liao | ............ | H01L 21/28518 |
| | | | | 257/751 |
| 5,525,543 A | 6/1996 | Chen | | |
| 5,565,708 A * | 10/1996 | Ohsaki | ............ | C23C 14/0641 |
| | | | | 257/740 |
| 5,624,870 A * | 4/1997 | Chien | ............ | H01L 21/76838 |
| | | | | 257/E21.582 |
| 5,654,235 A * | 8/1997 | Matsumoto | ............ | H01L 23/485 |
| | | | | 438/643 |
| 5,672,543 A | 9/1997 | Chang et al. | | |
| 5,962,923 A * | 10/1999 | Xu | ............ | C23C 14/0036 |
| | | | | 257/750 |
| 5,985,759 A * | 11/1999 | Kim | ............ | C23C 14/0641 |
| | | | | 257/E21.169 |
| 6,121,139 A * | 9/2000 | Chang | ............ | H01L 29/665 |
| | | | | 257/E21.165 |
| 6,146,998 A * | 11/2000 | Yamaha | ............ | H01L 21/7684 |
| | | | | 257/E21.583 |
| 6,171,717 B1 * | 1/2001 | Chang | ............ | H01L 21/76843 |
| | | | | 257/E21.584 |
| 6,177,338 B1 * | 1/2001 | Liaw | ............ | H01L 21/02129 |
| | | | | 257/E21.252 |
| 6,207,557 B1 * | 3/2001 | Lee | ............ | H01L 21/28556 |
| | | | | 257/E21.17 |
| 6,235,632 B1 * | 5/2001 | Nogami | ............ | H01L 21/76841 |
| | | | | 257/E21.584 |
| 6,274,487 B1 * | 8/2001 | Suzuki | ............ | H01L 21/76843 |
| | | | | 257/E21.584 |
| 6,316,353 B1 * | 11/2001 | Selsley | ............ | H01L 21/28061 |
| | | | | 257/E21.2 |
| 6,319,826 B1 * | 11/2001 | Chen | ............ | H01L 21/7684 |
| | | | | 257/E21.583 |
| 6,511,910 B2 * | 1/2003 | Asahina | ............ | H01L 21/2855 |
| | | | | 257/E21.169 |
| 6,706,626 B2 * | 3/2004 | Huang | ............ | H01L 21/76846 |
| | | | | 438/637 |
| 7,160,803 B2 | 1/2007 | Kim et al. | | |
| 7,226,858 B2 * | 6/2007 | Williams | ............ | H01L 21/76846 |
| | | | | 257/763 |
| 7,709,376 B2 | 5/2010 | Matsuyama et al. | | |
| 2004/0253807 A1 * | 12/2004 | Thei | ............ | H01L 21/76846 |
| | | | | 438/627 |
| 2011/0084320 A1 * | 4/2011 | Jung | ............ | H01L 21/28512 |
| | | | | 257/288 |
| 2016/0043035 A1 * | 2/2016 | Lin | ............ | H01L 21/76802 |
| | | | | 257/751 |

OTHER PUBLICATIONS

Wang et al., "Thermal stability of a-titanium in contact with titanium nitride", Journal of Applied Physics, vol. 79 No. 5, Mar. 1, 1996, pp. 2446-2457.

* cited by examiner

DOUBLE BARRIER LAYER SETS FOR CONTACTS IN SEMICONDUCTOR DEVICE

BACKGROUND

The present disclosure relates to semiconductor fabrication, and more specifically, to methods and semiconductor devices having contact openings with double barrier layer sets.

Figure 1:
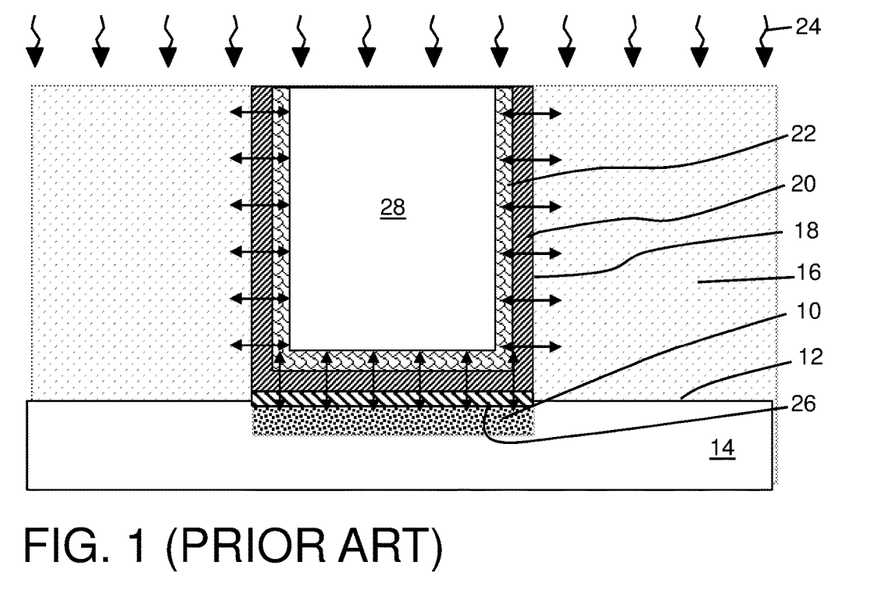
FIG. 1 shows a cross-sectional view of a conventional single barrier layer set including cracks in the nitride barrier layer.

During semiconductor fabrication, contacts are used to vertically electrically connect different devices in a semiconductor device. As shown in FIG. 1, the process may include creating a doped or implanted region 10 in a surface 12 of a semiconductor substrate 14, and forming an interlayer dielectric layer 16 thereover. A contact opening 18 is then formed by optical lithography through interlayer dielectric layer 16 to the doped or implanted region 10. A pair of layers 20, 22 may be provided in contact opening 18 to prevent metal migration into interlayer dielectric layer 16, e.g., of tungsten. Titanium layer 20 is used to form silicide to form an ohmic contact, and titanium nitride barrier layer 22 acts as a barrier to migration. A typical approach provides titanium layer 20 deposited into contact opening 18, and titanium nitride barrier layer 22 thereover to protect underlying titanium layer 20 from fluorine attack during later tungsten deposition to form the contact. More particularly, a later chemical vapor deposition step oftentimes uses tungsten fluoride gas that upon decomposition forms the tungsten fill for remaining portion 28 of contact opening 18. Prior to tungsten formation, an anneal 24 is performed to create titanium silicide region 26 at the junction of titanium layer 20 and semiconductor substrate 14, i.e., at doped or implanted region 10. One challenge with this process is the high temperature anneal 24 (e.g., at 800° C.) degrades titanium nitride barrier layer 22. More particularly, the high temperature: changes the composition of the titanium nitride by dissolution of the nitrogen from the titanium nitride into titanium layer 20, and creates thermal expansion of titanium layer 20 (see arrows) that creates cracks in titanium nitride barrier layer 22. The cracks make titanium nitride barrier layer 22 ineffective at protecting titanium layer 20 during later formation of tungsten in remaining portion 28 of contact opening 18. During tungsten fluoride chemical vapor deposition to form the tungsten fill, growth defects (not shown) (known as volcano defects) may form in the contact due to the reaction of the fluorine and titanium through the degraded titanium nitride barrier layer.

SUMMARY

A first aspect of the disclosure is directed to a method of forming a contact for a semiconductor device, the method comprising: creating a contact opening through a dielectric layer to a semiconductor substrate of the semiconductor device; depositing a first metal layer in the contact opening, the first metal layer contacting the semiconductor substrate; depositing a first nitride barrier layer on the first metal layer; annealing after depositing the first nitride layer to form a silicide region in a junction area underlying the contact opening with the first metal layer and the semiconductor substrate; after the annealing, depositing a second metal layer on the first nitride barrier layer; depositing a second nitride barrier layer on the second metal layer; and forming a conductor in a remaining portion of the contact opening.

A second aspect of the disclosure includes a method of forming a contact for a semiconductor device, the method comprising: creating a contact opening through a dielectric layer to a semiconductor substrate of the semiconductor device; depositing a first titanium layer in the contact opening, the first titanium layer contacting the semiconductor substrate; depositing a first titanium nitride barrier layer on the first titanium layer; annealing after depositing the first titanium nitride barrier layer to form titanium silicide region in a junction area underlying the contact opening with the first titanium layer and the semiconductor substrate; after the annealing, depositing a second titanium layer on the first titanium nitride barrier layer; depositing a second titanium nitride barrier layer on the second titanium layer; and forming tungsten in a remaining portion of the contact opening using chemical vapor deposition using tungsten fluoride, wherein the contact is devoid of volcano defects.

A third aspect of the disclosure related to a semiconductor device comprising: a contact in a contact opening in a dielectric layer, the contact including: a titanium silicide region at a junction with an underlying semiconductor substrate; a first titanium layer adjacent the dielectric layer; a first titanium nitride barrier layer adjacent the first titanium layer; a second titanium layer adjacent the first titanium nitride barrier layer; a second titanium nitride barrier layer adjacent the second titanium layer; and a conductor in a remaining portion of the contact opening not filled by other layers.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the present disclosure provide methods of forming a contact for a semiconductor device with double barrier layer sets, and a device so formed. Methods may include depositing a first metal layer contacting the semiconductor substrate in a contact opening in a dielectric layer over the semiconductor substrate. A first nitride barrier layer may be deposited on the first metal layer. An anneal after depositing the first nitride barrier layer forms a silicide region in a junction area underlying the contact opening with the first metal layer and the semiconductor substrate. In contrast to conventional processes, after the annealing, a second metal layer may be deposited on the first nitride barrier layer, and then a second nitride barrier layer may be deposited on the second metal layer. A conductor may then be formed in a remaining portion of the contact opening. Since the second nitride barrier layer is not exposed to the anneal, there is no barrier property degradation, and it forms a good barrier against fluorine attack and thus prevents volcano defects.

Figure 2:
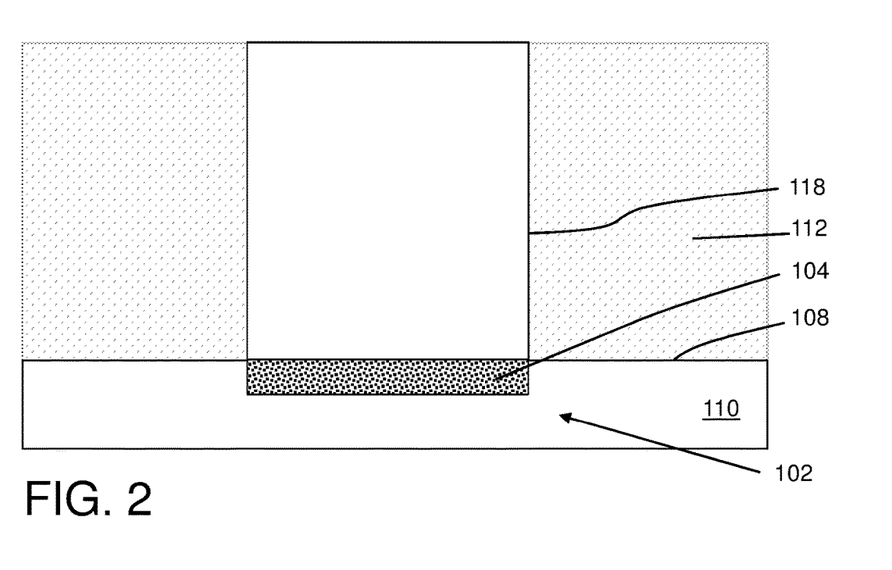
FIGS. 2-7 show cross-sectional views of semiconductor structure undergoing a method according to embodiments of the disclosure, with FIG. 7 showing a cross-sectional view of embodiments of a semiconductor device including a contact according to embodiments of the disclosure.

Referring to FIGS. 2-7, cross-sectional views of a method of forming contact 100 (FIG. 7) for a semiconductor device 102 according to embodiments of the disclosure will be described. While not shown in its entirety, semiconductor device 102 may include any now known or later developed integrated circuit device upon which contact 100 is made to a semiconductor portion thereof. In FIG. 2, a doped or implanted region 104 in a semiconductor substrate 110 is shown as an example. Doped or implanted region 104 may include, for example, a source or drain region of a transistor. As understood, the dopants used may vary according to the type of device. N-type dopants may include but are not limited to: phosphorous (P), arsenic (As), antimony (Sb); and p-type dopants may include but are not limited to: boron (B), indium (In) and gallium (Ga).

In FIG. 2, semiconductor substrate 110 is shown having a dielectric layer 112 thereover. Semiconductor substrate 110 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{S2}$, where A1, A2, B1, and B2 are relative proportions each greater than or equal to zero and A1+A2+B1+B2=1 (1 being a total mole quantity). Furthermore, a portion or entire semiconductor substrate 110 may be strained. Semiconductor substrate 110 may be a bulk substrate or a semiconductor-on-insulator (SOI) layer of an SOI substrate.

Dielectric layer 112 may include any now known or later developed interlayer dielectric such as but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Dielectric layer 112 may be formed on semiconductor substrate 110 in any known fashion such as deposition. Unless otherwise stated, "depositing" or "deposition" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

In the description that follows, any excess material layers that would cover an upper surface of the device, e.g., after deposition thereof, have been omitted for brevity. It is understood that any removing steps necessary to remove any excess material from an upper surface prior to proceeding with subsequent steps may be carried out, e.g., via planarization. Planarization refers to various processes that make a surface more planar (that is, more flat and/or smooth) and removes materials from an upper surface thereof. Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This process removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

FIG. 2 also shows creating a contact opening 118 through dielectric layer 112 to semiconductor substrate 110 of semiconductor device 102. In the example shown, contact opening 118 exposes doped or implanted region 104 in a surface 108 of semiconductor substrate 110, but it could expose any portion of semiconductor substrate 110 or other underlying element upon which a contact is desired. Contact opening 118 may be formed using any known lithography technique. In lithography (or "photolithography"), a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask (not shown) for the underlying layers which can then be selectively treated, such as etching to open contact opening 118. Once completed, any remaining mask may be removed using conventional techniques, e.g., ashing.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as contact opening 118.

At the FIG. 2 stage, embodiments of the disclosure may also include performing a cleaning to remove native oxide and some dielectric, e.g., performing a SiConi™ cleaning. A SiConi™ cleaning is a remote plasma-assisted chemical etch that includes simultaneous exposure of a layer to $NF_3$ and $NH_3$ plasma byproducts. Plasma excitation of $NF_3$ and $NH_3$ species allows a plasma-damage-free cleaning process.

Figure 3:
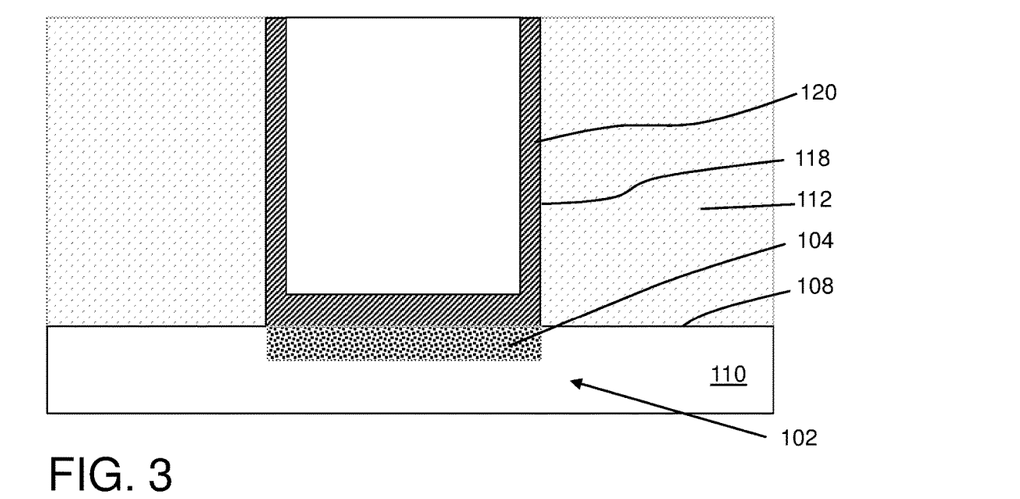

FIG. 3 shows depositing a first metal layer 120 in contact opening 118. First metal layer 120 contacts semiconductor substrate 110, i.e., at doped or implanted region 104, and otherwise contacts dielectric layer 112. In one embodiment, first metal layer 120 may include titanium. However, other metal layer materials may also be employed, e.g., cobalt, nickel, nickel platinum, etc. First metal layer 120 may be deposited using any appropriate deposition technique, e.g., PVD, CVD or ALD. In one embodiment, first metal layer 120 may have a thickness less than that typically used in a single barrier layer set. For example, first metal layer 120 may have a thickness of approximately 40-100 Angstroms (Å).

Figure 4:
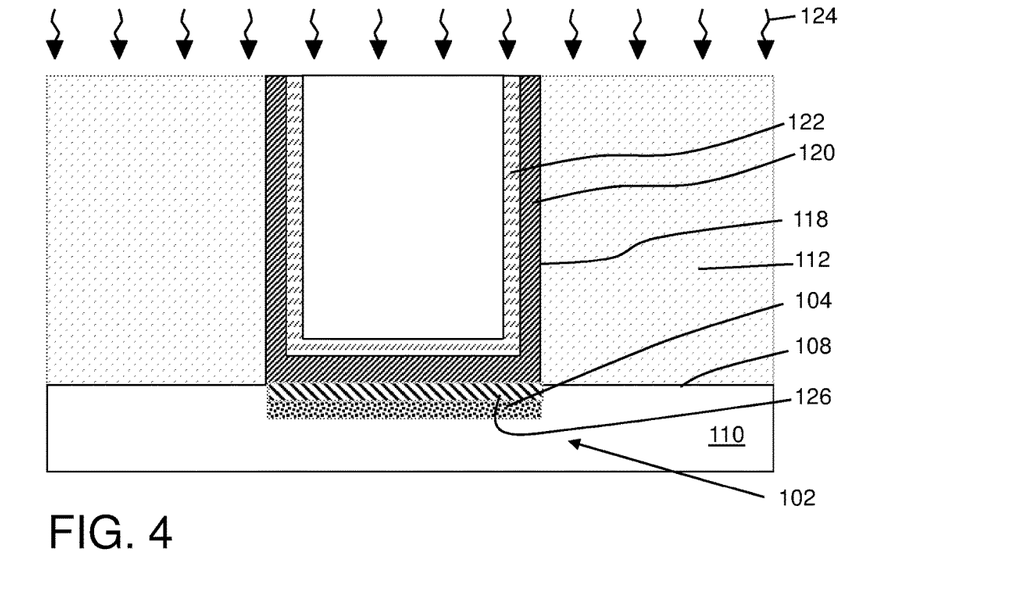

FIG. 4 shows depositing a first nitride barrier layer 122 on first metal layer 120. First nitride barrier layer 122 contacts first metal layer 120. In one embodiment, first nitride barrier layer 122 may include titanium nitride. However, other nitride barrier layer materials may also be employed, e.g., tantalum nitride. First nitride barrier layer 122 may be deposited using any appropriate deposition technique, e.g., PVD, CVD or ALD. In one embodiment, first nitride barrier layer 122 may have a thickness less than that typically used in a single barrier layer set. For example, first nitride barrier layer 122 may have a thickness of approximately 10-30 Å. First metal layer 120 and first nitride barrier layer 122 collectively form a first barrier layer set.

With continuing reference to FIG. 4, an annealing 124 (heat treatment) may be performed after depositing first nitride barrier layer 122 (FIG. 4) to form a silicide region 126 in a junction area underlying contact opening 118 with first metal layer 120 and semiconductor substrate 110, i.e., at doped or implanted region 104. Silicide region 126 may include a metal-silicon alloy of whatever metal first metal layer 120 includes, e.g., titanium silicide. The annealing 124 may occur at any temperature necessary to form silicide region 126, e.g., between approximately 450° C. and 900° C. The amount of silicide region 126 formed may depend, for example, on the temperature and/or the duration of the annealing 124. In one embodiment, the annealing may include a dynamic surface anneal (DSA), i.e., a rapid thermal processing technique using a laser-based annealing tool. However, any now known or later developed annealing process such as but not limited to: DSA, rapid thermal anneal (RTA) and/or laser spike annealing (LSA), may also be employed. As described, first nitride barrier layer 122 may degrade during annealing.

Figure 5:
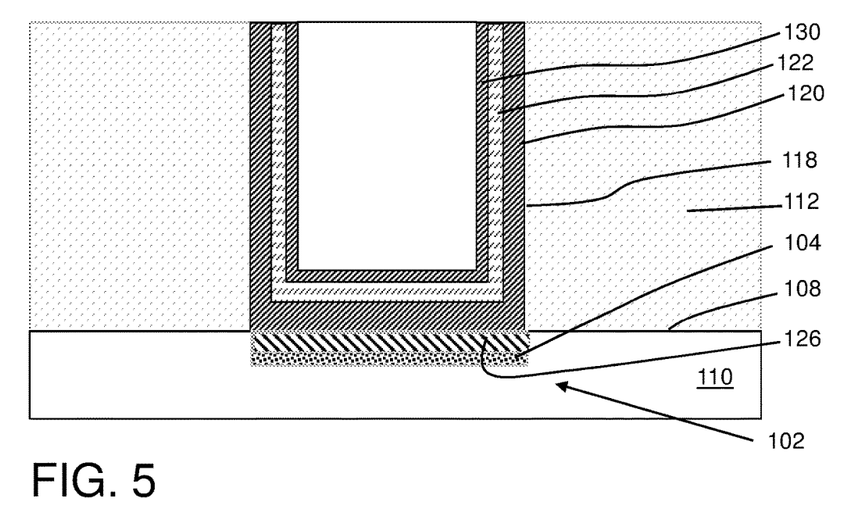
Figure 6:
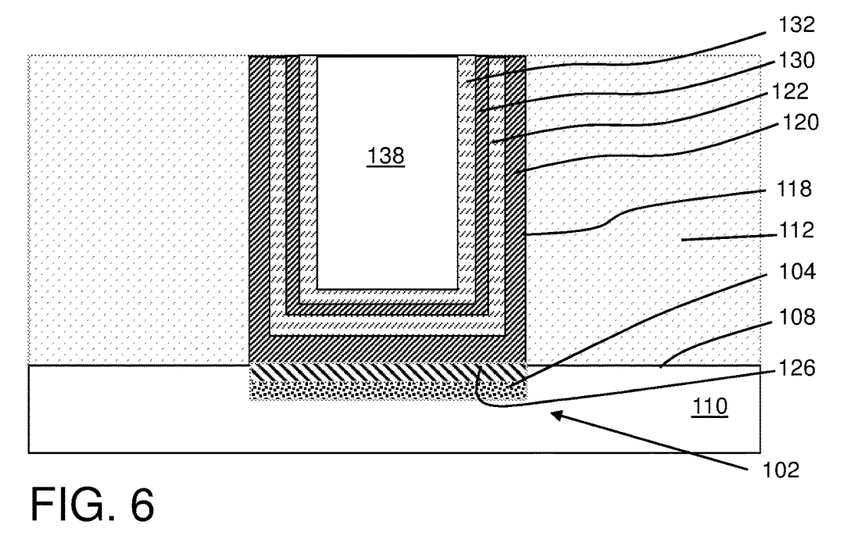

In order to address these challenges, FIGS. 5 and 6 show forming a second barrier layer set. In particular, FIG. 5 shows depositing a second metal layer 130 on first nitride barrier layer 122. Second metal layer 130 contacts first nitride barrier layer 122. In one embodiment, second metal layer 130 may include titanium. That is, first metal and second metal may both include titanium. However, other metal layer materials may also be employed, e.g., cobalt, nickel, tantalum, etc. Second metal layer 130 may be deposited using any appropriate deposition technique, e.g., PVD, CVD or ALD. In one embodiment, second metal layer 130 may have a thickness of approximately 1-35 Å.

Before depositing second metal layer 130, a metal oxide cleaning may be performed on first nitride barrier layer 122. The metal oxide cleaning may include any now known or later developed oxide cleaning process such as but not limited to: argon sputtering or oxide/nitride etching.

FIG. 6 shows depositing a second nitride barrier layer 132 on second metal layer 130. Second nitride barrier layer 132 contacts second metal layer 130. In one embodiment, second nitride barrier layer 132 may include titanium nitride. In this case, first nitride barrier layer 120 and second nitride barrier layer 132 may both include titanium nitride. However, other nitride barrier layer materials may also be employed, e.g., tantalum nitride. Second nitride barrier layer 132 may be deposited using any appropriate deposition technique, e.g., PVD, CVD or ALD. In one embodiment, second nitride barrier layer 132 may have a thickness of approximately 20-60 Å. Second metal layer 130 and second nitride barrier layer 132 collectively form the second barrier layer set. The stated thicknesses of layers 120, 122, 130, 132 provide a double barrier layer set having a collective thickness similar to conventional single barrier layer sets, but without the issues relevant to nitride barrier layer degradation and with reduced contact resistance.

Figure 7:
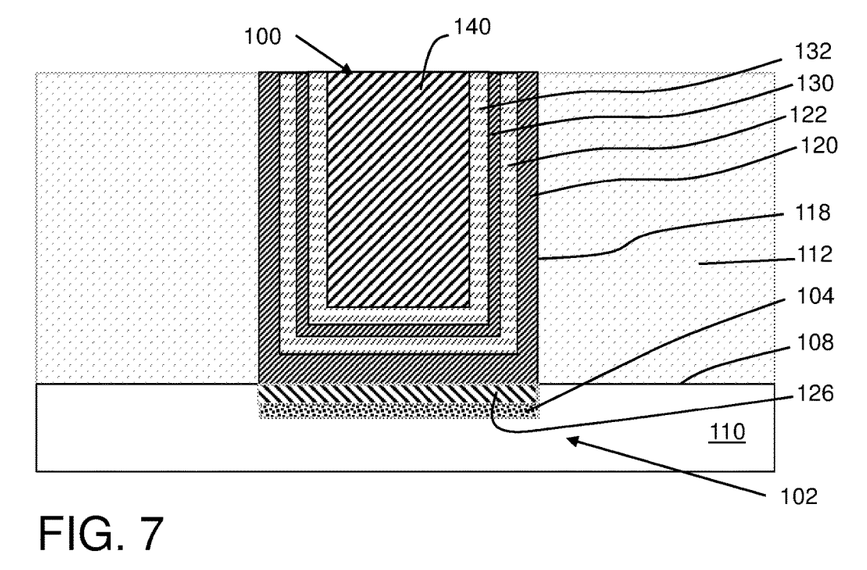

FIG. 7 shows forming a conductor 140 in remaining portion 138 (FIG. 6) of contact opening 118, i.e., filling any part not already filled by layers 120, 122, 130, 132, and forming contact 100. In one embodiment, conductor 140 may include tungsten. In this case, the conductor forming may include chemical vapor deposition using tungsten fluoride. Other conductor 140 materials may also be employed such as but not limited to copper, aluminum or doped polysilicon. In contrast to conventional processing, second nitride barrier layer 132 prevents any diffusion through degraded first nitride barrier layer 122 and thus prevents volcano defect formation. In particular, fluorine attack during conductor deposition of metal layers 120 and 130 is prevented by second nitride barrier layer 132, which was not exposed to an anneal and thus does not have degradation as in conventional processes. Consequently, contact 100 is devoid of volcano defects.

FIG. 7 also shows embodiments of semiconductor device 102 according to the disclosure. Semiconductor device 102 may include contact 100 in contact opening 118 in dielectric layer 112. Contact 100 will be described with each layer 120, 122, 130, 132 including titanium; it is recognized that other conductors as previously described may also be employed. Contact 100 may include first titanium layer 120 adjacent dielectric layer 112, and contacting doped or implanted region 104. Contact 100 may also include titanium silicide region 126 at a junction with underlying semiconductor substrate 110, i.e., at doped or implanted region 104. First titanium nitride barrier layer 122 may be adjacent first titanium layer 120, and second titanium layer 130 may be adjacent first titanium nitride barrier layer 122. Second titanium nitride barrier layer 132 may be adjacent second titanium layer 130. Conductor 140 may be positioned in remaining portion 138 (FIG. 6) of contact opening 112 not filled by other layers 120, 122, 130, 132. As noted, conductor 140 may include tungsten. As described herein, contact 100 is devoid of volcano defects due to the use of the second barrier layer set.

Embodiments of the disclosure provide a method that reduces contact resistance compared to conventional processes, and eliminates the challenges presented by degraded titanium nitride barrier layers after annealing, e.g., fluorine attack of underlying titanium. The double barrier layer sets, collectively, are not much thicker than conventional single barrier layer sets.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming a contact for a semiconductor device, the method comprising:
   creating a contact opening through a dielectric layer to a semiconductor substrate of the semiconductor device;
   depositing a first titanium layer in the contact opening, the first titanium layer contacting the semiconductor substrate;
   depositing a first titanium nitride barrier layer on the first titanium layer;
   annealing, after depositing the first titanium nitride barrier layer, to form a titanium silicide region in a junction area underlying the contact opening with the first titanium layer and the semiconductor substrate;
   after the annealing, depositing a second titanium layer on the first titanium nitride barrier layer, wherein at least a portion of the first titanium layer remains in the contact opening after depositing the second titanium layer;
   depositing a second titanium nitride barrier layer on the second titanium layer; and
   forming a conductor in a remaining portion of the contact opening.

2. The method of claim 1, further comprising performing a metal oxide cleaning prior to depositing the second titanium layer on the first titanium nitride barrier layer.

3. The method of claim 1, wherein the first titanium layer has a thickness of approximately 40-100 Angstroms (Å), the first titanium nitride barrier layer has a thickness of approximately 10-30 Å, the second titanium layer has a thickness of approximately 1-35 Å, and the second titanium nitride barrier layer has a thickness of approximately 20-60 Å.

4. The method of claim 1, further comprising performing a cleaning prior to depositing the first titanium layer.

5. The method of claim 1, wherein the conductor includes tungsten.

6. The method of claim 5, wherein forming the conductor includes chemical vapor deposition using tungsten fluoride.

7. The method of claim 6, wherein the contact is devoid of volcano defects.

8. The method of claim 1, wherein the annealing includes a dynamic surface anneal.

9. The method of claim 1, wherein depositing the first titanium layer is performed after creating the contact opening, depositing the first titanium nitride barrier layer is performed after depositing the first titanium layer, depositing the second titanium nitride barrier layer is performed after depositing the second titanium layer, and forming the conductor is performed after depositing the second titanium nitride barrier layer.

10. The method of claim 1, wherein depositing the second titanium layer is performed after the annealing without an intervening deposition process.

11. The method of claim 1, wherein depositing the second titanium nitride barrier layer is performed after depositing the second titanium layer without an intervening deposition process.

12. A method of forming a contact for a semiconductor device, the method comprising:
- creating a contact opening through a dielectric layer to a semiconductor substrate of the semiconductor device;
- depositing a first titanium layer in the contact opening, the first titanium layer contacting the semiconductor substrate;
- depositing a first titanium nitride barrier layer on the first titanium layer;
- annealing, after depositing the first titanium nitride barrier layer, to form titanium silicide region in a junction area underlying the contact opening with the first titanium layer and the semiconductor substrate;
- after the annealing, depositing a second titanium layer on the first titanium nitride barrier layer;
- depositing a second titanium nitride barrier layer on the second titanium layer; and
- forming tungsten in a remaining portion of the contact opening using chemical vapor deposition using tungsten fluoride, wherein the contact is devoid of volcano defects.

13. The method of claim 12, further comprising performing a metal oxide cleaning prior to depositing the second titanium layer on the first titanium nitride barrier layer.

14. The method of claim 12, wherein the annealing includes a dynamic surface anneal.

15. The method of claim 12, wherein the first titanium layer has a thickness of approximately 40-100 Angstroms (Å), and the first titanium nitride barrier layer has a thickness of approximately 10-30 Å.

16. The method of claim 12, wherein the second titanium layer has a thickness of approximately 1-35 Å, and the second nitride barrier layer has a thickness of approximately 20-60 Å.

17. The method of claim 12, further comprising performing a cleaning prior to depositing the first titanium layer.

* * * * *